US011447626B2

(12) United States Patent
Yahagi et al.

(10) Patent No.: US 11,447,626 B2
(45) Date of Patent: Sep. 20, 2022

(54) RESIN COMPOSITION FOR REINFORCEMENT AND ELECTRONIC COMPONENT DEVICE

(71) Applicant: KOKI COMPANY LIMITED, Tokyo (JP)

(72) Inventors: Takeshi Yahagi, Tokyo (JP); Kazuhiro Yukikata, Tokyo (JP); Koichi Sekiguchi, Tokyo (JP); Yusuke Satoh, Tokyo (JP); Tatsuya Baba, Tokyo (JP); Mitsuyasu Furusawa, Tokyo (JP)

(73) Assignee: KOKI COMPANY LIMITED, Tokyo (JP)

( * ) Notice: Subject to any disclaimer, the term of this patent is extended or adjusted under 35 U.S.C. 154(b) by 259 days.

(21) Appl. No.: 16/764,085

(22) PCT Filed: Nov. 1, 2018

(86) PCT No.: PCT/JP2018/040775
§ 371 (c)(1),
(2) Date: May 14, 2020

(87) PCT Pub. No.: WO2019/098053
PCT Pub. Date: May 23, 2019

(65) Prior Publication Data
US 2020/0325326 A1 Oct. 15, 2020

(30) Foreign Application Priority Data
Nov. 14, 2017 (JP) .............................. JP2017-219198

(51) Int. Cl.
| | |
|---|---|
| *H01L 21/56* | (2006.01) |
| *C08G 59/24* | (2006.01) |
| *C08G 59/50* | (2006.01) |
| *C08L 63/02* | (2006.01) |
| *C09J 163/02* | (2006.01) |
| *C08L 63/00* | (2006.01) |
| *C08G 59/22* | (2006.01) |
| *C08K 5/053* | (2006.01) |
| *C08K 5/09* | (2006.01) |
| *C08K 5/20* | (2006.01) |

(52) U.S. Cl.
CPC .......... *C08L 63/00* (2013.01); *C08G 59/226* (2013.01); *C08G 59/245* (2013.01); *C08G 59/5006* (2013.01); *C08G 59/5026* (2013.01); *H01L 21/56* (2013.01); *H01L 21/563* (2013.01); *C08K 5/053* (2013.01); *C08K 5/09* (2013.01); *C08K 5/20* (2013.01); *C08L 2203/206* (2013.01)

(58) Field of Classification Search
CPC ........ H01L 21/56; H01L 21/563; C08L 63/00; C09D 163/00; C08G 59/226; C08G 59/24; C08G 59/245; C08G 59/5006; C08G 59/5026
USPC .......... 438/108, 124, 126, 127; 523/427, 428
See application file for complete search history.

(56) References Cited

U.S. PATENT DOCUMENTS

| | | | |
|---|---|---|---|
| 2004/0250919 A1 | 12/2004 | Saito et al. | |
| 2007/0104960 A1* | 5/2007 | Asano | H01L 24/81 525/476 |
| 2009/0273070 A1* | 11/2009 | Tendou | C08G 59/686 257/E23.06 |
| 2016/0083537 A1 | 3/2016 | Shimura et al. | |

FOREIGN PATENT DOCUMENTS

| | | |
|---|---|---|
| JP | S56-70022 A | 6/1981 |
| JP | S60-69125 A | 4/1985 |
| JP | H09-316170 A | 12/1997 |
| JP | 2000-86911 A | 3/2000 |
| JP | 2008-239822 A | 10/2008 |
| JP | 2016-044277 A | 4/2016 |
| JP | 2016-135888 A | 7/2016 |
| JP | 2017177196 A | 10/2017 |
| TW | 201105697 A1 | 2/2011 |
| TW | 201631023 A | 9/2016 |
| WO | 03026835 A1 | 4/2003 |
| WO | 2010127907 A1 | 11/2010 |
| WO | 2014199843 A1 | 12/2014 |
| WO | 2016204183 A1 | 12/2016 |

OTHER PUBLICATIONS

Machine Translation of JP 60-069125 A (no date).*
Machine Translation of JP 09-316170 A (no date).*
International Search Report (Form PCT/ISA/210) for International Patent Application No. PCT/JP2018/040775, issued from the Japan Patent Office, dated Dec. 4, 2018, 5 pages, with English-language translation.

* cited by examiner

*Primary Examiner* — Michael J Feely
(74) *Attorney, Agent, or Firm* — Kilyk & Bowersox, P.L.L.C.

(57) ABSTRACT

Containing an epoxy compound and a curing agent and containing a bisphenol E type epoxy resin as the epoxy compound in an amount of 25 mass % or more and 100 mass % or less relative to the total amount of the epoxy compound.

17 Claims, 2 Drawing Sheets

RESIN COMPOSITION FOR REINFORCEMENT AND ELECTRONIC COMPONENT DEVICE

FIELD OF THE INVENTION

The present invention relates to a reinforcing resin composition and an electronic component device using the reinforcing resin composition.

BACKGROUND TO THE INVENTION

In association with advanced functions and reduction in size of portable electronic devices such as mobile phones and tablet devices, many electronic components involving solder-ball bonding such as a ball grid array (BGA) or a chip size package (CSP) have been used as an electronic component used for these electronic devices. Such an electronic component can be mounted on a substrate with high density but is vulnerable to strength in a solder bonding portion, in particular, a physical stress such as fall impact, and therefore a reinforcing resin composition has been used.

For example, Patent Documents 1 and 2 describe that a resin composition as an underfill material is filled and sealed between an electronic component such as a BGA package and a substrate.

Patent Document 3 describes bonding the four corners of a BGA package with a sidefill material made of a resin composition to reinforce solder bonding of terminals.

In Prior Documents 1 to 3, resin compositions containing a bisphenol A type, or bisphenol F type epoxy resin as a main component are exemplified as a resin composition for reinforcement. These epoxy resins are cured in a state of being interposed between the electronic component and the substrate, to thereby physically bond the electronic component and the substrate and reinforce the bonding of both components. Epoxy compounds of these epoxy resins or the like are suitable for applications for bonding and reinforcing electronic components due to their high heat resistance.

However, it has been found that the bisphenol A type epoxy resin is harmful to the human body. Therefore, reduction in the amount of the bisphenol A type epoxy resin used has been desired in order to reduce the load on the environment. Further, the bisphenol A type epoxy resin tends to be crystallized, in particular, it is solidified when being stored at a relatively low temperature such as a temperature equal to or lower than ordinary temperature for a long period of time, resulting in high viscosity even when the temperature is raised again. Although the bisphenol F type epoxy resin has little influence on the environment, the problem that it tends to be crystallized is the same as the bisphenol A type epoxy resin. When the viscosity of the resin composition becomes high, it becomes difficult to dispense the resin composition. This makes it difficult to stably supply the resin composition, leading to insufficient reinforcement. In particular, in the case where a space between mounted components or a space between the electronic component and the substrate is very small due to high density mounting, an increased viscosity results in significant difficulty in stable supply of the resin composition.

DOCUMENTS FOR PRIOR ART

Patent Document 1: JP 2008-239822 A
Patent Document 2: JP 2016-135888 A
Patent Document 2: JP 2016-44277 A

SUMMARY OF THE INVENTION

Problem to be Solved by the Invention

The present invention is conceived in light of the above-described problems of the conventional arts, and an object of the present invention is to provide a reinforcing resin composition that exhibits less increase in the viscosity even at low temperatures and thus enables stable supply to a reinforcing portion and sufficient reinforcement of electronic component connection.

An object of the present invention is to provide an electronic component device in which a portion around the solder bonding portion is sufficiently reinforced.

Means for Solving the Problems

The present invention contains an epoxy compound and a curing agent, and contains a bisphenol E type epoxy resin as the epoxy compound in an amount of 25 mass % or more and 100 mass % or less relative to the total amount of the epoxy compound.

According to the present invention, a reinforcing resin composition contains an epoxy compound and a curing agent, and contains a bisphenol E type epoxy resin as the epoxy compound in an amount of 25 mass % or more and 100 mass % or less relative to the total amount of the epoxy compound, and thus exhibits less increase in the viscosity at a relatively low temperature such as a temperature equal to or lower than room temperature. Accordingly, a reinforcing resin composition can be stably supplied to a reinforcing portion around the electronic component, the substrate, and solder bonding, and thus bonding can be securely reinforced.

In the present invention, the reinforcing resin composition may further contain a gelling agent.

In this case, the gelling agent may also be at least one type selected from the group consisting of amide-based gelling agents, sorbitol-based gelling agents, and fatty acid triglycerides.

In the present invention, the epoxy compound may also be a mixture of the bisphenol E type epoxy resin and at least one type selected from the group consisting of a bisphenol A type epoxy resin and a bisphenol F type epoxy resin.

In the present invention, the epoxy compound may also be a mixture of a bisphenol E type epoxy resin, a bisphenol A type epoxy resin, and a bisphenol F type epoxy resin.

In the present invention, the epoxy compound may also be an epoxy resin having an epoxy group at both ends.

In the present invention, the content of chlorine in the epoxy compound may also be 900 ppm or less.

In the present invention, the curing agent may also be at least one type selected from the group consisting of alicyclic polyamines, aliphatic polyamines, and modified products thereof.

In the present invention, the reinforcing resin composition may further contain a filler, and the content of the filler may also be 30 parts by mass or more and less than 180 parts by mass per 100 parts by mass of the epoxy compound.

In the present invention, curing temperature may also be 80° C. or higher and 200° C. or lower.

In the present invention related to the electronic component device, a substrate and an electronic component are bonded via a solder bump, and the electronic component device includes a reinforcing part made of any of the above-described reinforcing resin compositions between the substrate and the electronic component.

According to the present invention, in the electronic component device, a substrate and an electronic component are bonded via a solder bump, and the electronic component device includes a reinforcing part made of any of the above-described reinforcing resin compositions between the substrate and the electronic component. Thus, decrease in the viscosity of the reinforcing resin composition is small even in a relatively low temperature such as room temperature, and a reinforcing part can be securely formed in a reinforcing portion around the electronic component, the substrate, and solder bonding, thus sufficiently reinforcing bonding.

In the present invention related to the electronic component device, the reinforcing part may also be formed between the peripheral part of the electronic component and the substrate.

Effects of Invention

According to the present invention, a reinforcing resin composition can be provided that exhibits less increase in the viscosity even at low temperatures and thus enables stable supply to a reinforcing portion and sufficient reinforcement of electronic component connection.

Further, according to the present invention, an electronic component device can be provided in which a portion around the solder bonding portion is sufficiently reinforced.

DETAILED DESCRIPTION OF THE INVENTION

Figure 1:
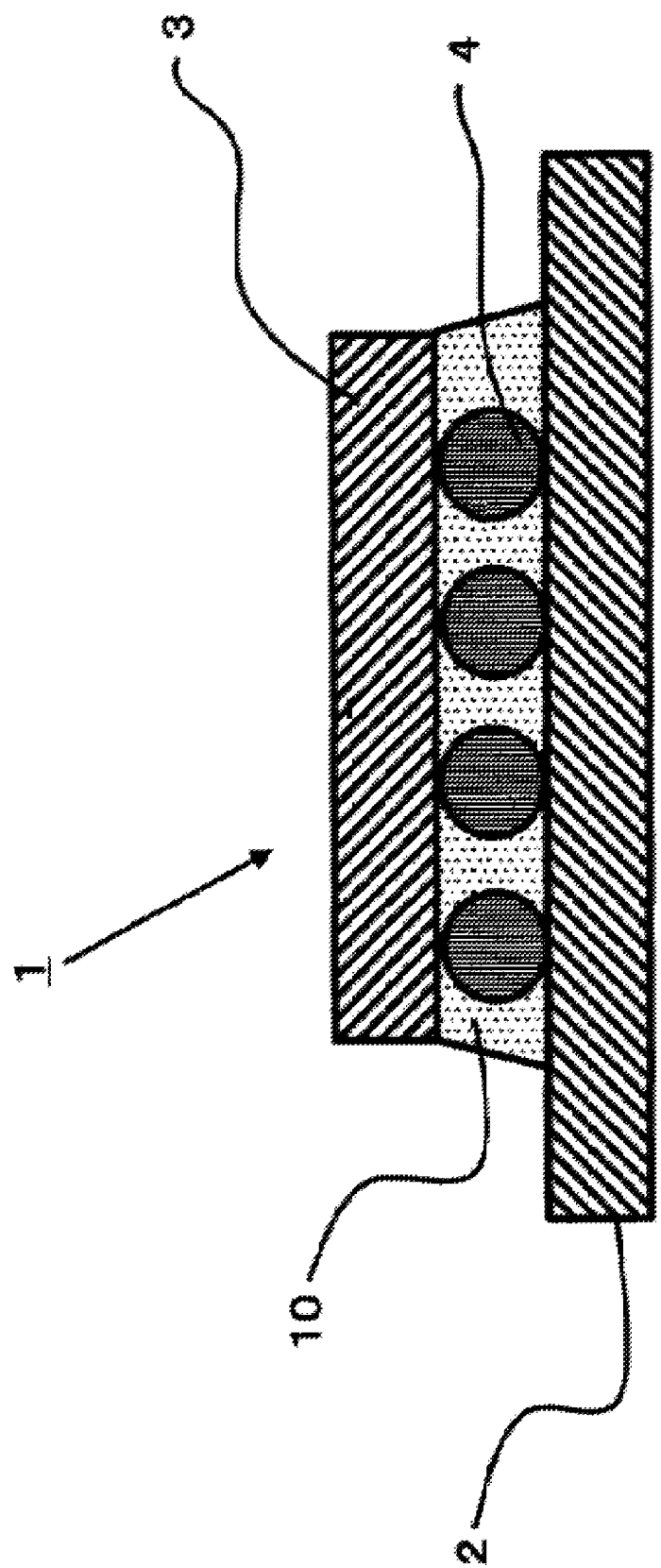
FIG. 1 is a cross-sectional view schematically illustrating an electronic component device of Examples of the present invention.

Hereinafter, the reinforcing resin composition and the electronic component device according to the present invention will be described.

The reinforcing resin composition of the present embodiment (hereinafter, simply referred to as a resin composition) contains an epoxy compound and a curing agent, and the content of a bisphenol E type epoxy resin is 25 mass % or more and 100 mass % or less relative to the total amount of the epoxy compound.

The resin composition of the present embodiment contains an epoxy compound as a main component. The epoxy compound is not particularly limited, and an epoxy compound of a liquid epoxy resin, a solid epoxy resin or the like can be appropriately used. Specific examples of the epoxy compound include epoxy resins having a bisphenol backbone, such as a bisphenol A type epoxy resin, a bisphenol E type epoxy resin, and a bisphenol F type epoxy resin; biphenyl type epoxy resins; naphthalene ring-containing epoxy resins and hydrogenated epoxy resins thereof; and alicyclic epoxy resins. These epoxy compounds can be used alone, or a plurality of these epoxy compounds can be combined and used.

In the present embodiment, the epoxy compound is preferably an epoxy resin having an epoxy group at both ends. Specific examples thereof include thermosetting resins such as epoxy resins having a bisphenol backbone, including a bisphenol A type epoxy resin, a bisphenol E type epoxy resin, and a bisphenol F type epoxy resin having an epoxy group at both ends.

The epoxy compound is preferably, for example, one having an epoxy equivalent of 140 or more and 240 or less and a viscosity of 1 or more and 15 Pa·s or less.

Note that the epoxy equivalent (g/eq) in the present embodiment is the mass of resin containing 1 equivalent of an epoxy group and a value measured in accordance with JIS K7236:2001. The viscosity of the present embodiment refers to a value measured by the measurement method shown in Examples described later.

The resin composition of the present embodiment contains a bisphenol E type epoxy resin as an epoxy compound, serving as a necessary component. The content of the bisphenol E type epoxy resin is 25 mass % or more and 100 mass % or less, and preferably 40 mass % or more and 70 mass % or less relative to the total amount of the epoxy compound.

The resin composition of the present embodiment contains a bisphenol E type epoxy resin, and thus can suppress crystallization at low temperatures. As a result, the resin composition of the present embodiment can suppress increase in the viscosity even when being stored at a relatively low temperature such as a temperature equal to or lower than ordinary temperature.

The epoxy compound of the present embodiment may also be a mixture of a bisphenol E type epoxy resin and at least one type selected from the group consisting of a bisphenol A type epoxy resin and a bisphenol F type epoxy resin.

The bisphenol A type epoxy resin has high heat resistance and is widely used as a reinforcing resin composition. However, the use of the bisphenol A type epoxy resin is preferably reduced from the perspective that the bisphenol A contained as an impurity is harmful to the human body.

The bisphenol F type epoxy resin is less harmful than the A type, but use of the bisphenol F type epoxy resin is preferably suppressed from the perspective that crystallization proceeds at a low temperature such as a temperature equal to or lower than room temperature similarly to the A type, and thus the viscosity tends to increase.

By allowing the bisphenol E type epoxy resin to be contained as a necessary component in the resin composition of the present embodiment, crystallization at low temperatures can be suppressed without blending an additive and increase in the viscosity can be suppressed accordingly.

Note that in the case where a bisphenol A type epoxy resin is contained as the epoxy compound, the content of the bisphenol A type epoxy resin is 10.0 mass % or less, and preferably 3.0 mass % or more and 5.0 mass % or less of the total amount of the epoxy compound from the perspective of achieving good viscosity stability and reducing harmfulness to the human body.

The epoxy compound may be a bisphenol E type epoxy resin alone, but for example, may be a mixture of a bisphenol E type epoxy resin and a bisphenol A type epoxy resin, a mixture of a bisphenol E type epoxy resin and a bisphenol F type epoxy resin, or a mixture of a bisphenol E type epoxy resin, a bisphenol A type epoxy resin, and a bisphenol F type epoxy resin. In the case where the epoxy compound is a mixture of a bisphenol E type epoxy resin, a bisphenol A type epoxy resin, and a bisphenol F type epoxy resin, increase in the viscosity due to crystallization can be further suppressed, which is preferable.

In the case where the epoxy compound is a mixture of a bisphenol E type epoxy resin, a bisphenol A type epoxy resin, and a bisphenol F type epoxy resin, a mass mixing ratio of respective epoxy resins is, for example, bisphenol E type epoxy resin:bisphenol A type epoxy resin:bisphenol F type epoxy resin=(E)100:(A) 3 to 15:(F) 30 to 250, and further (E)100:(A) 3 to 10:(F) 30 to 180.

In the resin composition of the present embodiment, the content of chlorine in the epoxy compound is 900 ppm or less, preferably 700 ppm, and more preferably 600 ppm or less.

Chlorine may be mixed as an impurity in the production process of the epoxy compound. An epoxy compound having a small content of chlorine is preferably used from the perspective of reducing the environmental load.

Meanwhile, in the case where impurities such as chlorine have been removed, a problem also occurs in which the epoxy compound is more likely to be crystallized.

The resin composition of the present embodiment can suppress crystallization of the epoxy compound even when chlorine has been removed, and thus can reduce the halogen content.

Examples of the curing agent of the resin composition of the present embodiment include alicyclic polyamines, aliphatic polyamines and modified products thereof, boron trifluoride-amine complex, dicyandiamide, and organic acid hydrazide.

By using these curing agents, curing reaction of the epoxy compound at a low temperature such a temperature equal to or lower than ordinary temperature can be suppressed. Further, these curing agents have potential curability, and in the case where a curing agent with a potential curability is used, progression of curing reaction can be further suppressed and increase in the viscosity can also be suppressed, which is preferred.

As the curing agent, alicyclic polyamines, aliphatic polyamines, and the modified products thereof are preferred in that the halogen content is relatively small and the curing temperature is appropriate.

The content of the curing agent is 5 parts by mass or more and 40 parts by mass or less, and preferably 10 parts by mass or more and 20 parts by mass or less per 100 parts by mass of the epoxy compound.

The content within the above-described range suppresses increase in the viscosity as well as provides a cured product having an appropriate strength.

The resin composition of the present embodiment may further contain a filler.

The filler is not particularly limited, and a publicly known filler can be appropriately used. Examples of the filler include inorganic fillers such as silica, talc, and alumina, and organic fillers. The particle size of the filler is not particularly limited, but, for example, the average particle size is preferably 10 nm or more and 30 µm or less from the perspective of a filling property and mechanical strength.

In the case where the resin composition is used as an underfill material, a filler having an average particle size of 1 µm or less is preferred from the perspective of a filling property.

In the case where the resin composition is used as a side fill material, a filler having an average particle size of 1 µm or more is preferred from the perspective of reducing thermal expansion by allowing a large amount of filler to be contained.

The content of the filler is, for example, 30 parts by mass or more and less than 180 parts by mass, and preferably 100 parts by mass or more and less than 150 parts by mass per 100 parts by mass of the epoxy compound.

In the case where the content of the filler is such a content, increase in the viscosity of the resin composition can be suppressed and the thermal expansion coefficient of the cured product that has been cured can be made small.

The resin composition of the present embodiment may further contain a gelling agent.

Inclusion of the gelling agent can prevent the resin composition from sagging when the resin composition is applied, and heat cured.

The gelling agent in the present embodiment is not particularly limited as long as the gelling agent has an action of gelling an epoxy resin.

Examples of the gelling agent of the present embodiment include amide-based gelling agents, sorbitol-based gelling agents, and fatty acid triglycerides.

Examples of the amide-based gelling agent include fatty acid monoamides obtained by condensation polymerization of amine and carboxylic acid, such as polyamide, stearic acid amide, lauric acid amide, oleic acid amide, erucic acid amide, and 12-hydroxy stearic acid amide; substituted fatty acid amides such as N-oleylstearic acid amide, and N-stearylstearic acid amide; substituted fatty acid bisamides such as N,N'-ethylenebislauric acid amide, N,N'-ethylenebisstearic acid amide, N,N'-hexamethylenebisstearic acid amide, and N,N'-distearyladipic acid amide; alkylol amides such as stearic acid monomethylol amide; hydrogenated castor oil; and beeswax.

Examples of the sorbitol-based gelling agent include 1,3:2,4-bis-O-(4-methylbenzylidene)-D-sorbitol, and 1,3:2,4-bis-O-benzylidene-D-glucitol (available from New Japan Chemical Co., Ltd.).

Examples of the fatty acid triglyceride include 12-hydroxystearic acid triglyceride (hydrogenated castor oil), trade name: COCONARD ML (fatty acid C8, C10, C12 triglyceride), trade name: COCONARD MT (fatty acid C8, C10 triglyceride), trade name: COCONARD RK (fatty acid C8 triglyceride) (available from Kao Corporation), trade name: PANACET 800B (2-ethylhexyl triglyceride), trade name: PANACET 810, and trade name: PANACET 8105 (medium-chain triglyceride) (available from NOF Corporation).

The melting point of the gelling agent is, for example, 130° C. or higher and preferably 165° C. or higher. A gelling agent having the above-described melting point can express a performance of maintaining the shape at the thermosetting temperature.

The content of the gelling agent is, for example, 0.5 parts by mass or more and less than 20 parts by mass, and further 0.5 parts by mass or more and less than 15 parts by mass per 100 parts by mass total of the epoxy resin.

In particular, in the case of the amide-based gelling agent, the content of the amide-based gelling agent is preferably 1 part by mass or more and 3 parts by mass or less per 100 parts by mass total of the epoxy resin.

Further, in the case of the fatty acid triglyceride, the content of the fatty acid triglyceride is preferably 2 parts by mass or more and 20 parts by mass or less per 100 parts by mass total of the epoxy resin.

Further, in the case of the sorbitol-based gelling agent, the content of the sorbitol-based gelling agent is preferably 0.1 parts by mass or more and less than 10 parts by mass, and further 0.5 parts by mass or more and less than 5 parts by mass per 100 parts by mass total of the epoxy resin.

The resin composition of the present embodiment can suppress decrease in the glass transition temperature after curing. Decrease in the glass transition temperature after curing causes the following problems.

That is, in the case where the resin composition is used for bonding and reinforcing the electronic component, heating at a temperature exceeding the glass transition temperature of the cured resin composition results in a large thermal expansion coefficient of the cured product and a large difference in thermal expansion coefficient between the reinforced electronic component and the solder bonding portion. As a result, an excessive stress is applied to the electronic component and the solder bonding portion, causing occurrence of cracks, loss of functions, or the like.

In particular, when the electronic component is subjected to a temperature cycle test which is a reliability test for the electronic component, such a problem tends to occur.

Decrease in the glass transition temperature tends to occur, for example, in the case where an additive for suppressing crystallization, such as a reactive diluent is blended to the resin composition. The resin composition of the present embodiment can suppress crystallization without blending an additive such as a reactive diluent. Accordingly, the resin composition of the present embodiment can suppress decrease in the glass transition temperature after curing while suppressing crystallization.

The glass transition temperature of the resin composition of the present embodiment is, for example, 85° C. or higher and 180° C. or lower, and further 100° C. or higher and 170° C. or lower. Note that the glass transition temperature mentioned in the present embodiment refers to a value measured by the measurement method described in Examples described later.

The reinforcing resin composition of the present embodiment is preferably cured at, for example, 80° C. or higher and 200° C., and further 100° C. or higher and 170° C. or lower.

The reinforcing resin composition of the present embodiment can be used for reinforcing a solder bonding portion of the electronic component or the like. For example, the solder bonding portion fixes the electronic component to the substrate or the like via fusing of the solder, and thus the resin composition is also heated. In the case where the reinforcing resin composition is used for a component to be heated as described above, heat sagging, in which the resin composition is fused to flow down and spread, may occur. When the resin composition sags by heat, the reinforcing target such as the electronic component may not be sufficiently reinforced. In the case where the reinforcing resin composition of the present embodiment is a resin composition that is cured in the range described above, the reinforcing resin composition is cured during heating. Thus, heat sagging of the resin composition can be suppressed even in the case where the resin composition is used for applications that require heating. Therefore, sufficient reinforcing and curing can be achieved.

The resin composition of the present embodiment may further contain other publicly known additives in a range that does not hinder the effect described above.

Next, the electronic component device of the present embodiment will be described with reference to FIGS. 1 and 2.

In the electronic component device 1 of the present embodiment, a substrate 2 and an electronic component 3 are bonded via a solder bump 4. The electronic component device 1 includes a reinforcing part 10 made of the reinforcing resin composition of the present embodiment as described above between the substrate 2 and the electronic component 3.

Examples of the electronic component 3 of the electronic component device 1 of the present embodiment include plate-like components such as semiconductor packages including a CSP and a BGA, and bare chips.

When such an electronic component 3 is mounted (electrically connected) on the substrate 2 such as a printed circuit board, on which a circuit has been formed, the electronic component 3 is mounted on the substrate 2 by solder bonding the solder bump 4 formed on the electronic component 3 to the circuit part of the substrate 2.

Specifically, for example, in the case of an electronic component including a plate-like component such as the semiconductor package, one side of the plate-like component in which solder balls are disposed in a grid form is brought into contact with the circuit substrate, and the plate-like component and the circuit substrate are disposed so as to face each other and heated. The solder balls are fused to form a solder bump, and thereby such an electronic component is mounted on the circuit substrate.

The above-described resin composition is filled between the component and the substrate in a state in which the electronic component has been mounted on the circuit substrate.

The method for filling the resin composition is not particularly limited, but as illustrated in FIG. 1, a method is exemplified in which an electronic component 3 such as a CSP or a BGA is disposed on a substrate 2 via a solder bump 4, followed by connecting in a reflow process, and then a resin composition is dispensed so as to fill the gap between the substrate 2, the electronic component 3, and the solder bump 4 and further cured to form a reinforcing part 10.

Figure 2:
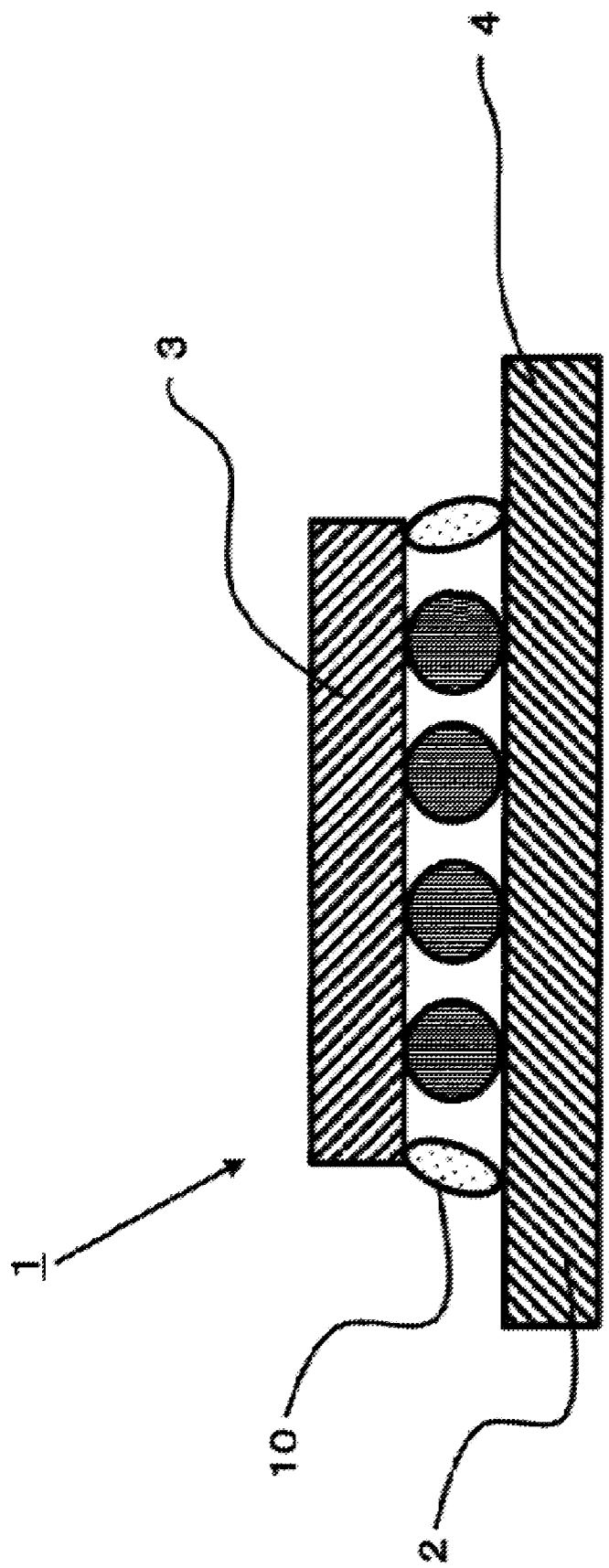
FIG. 2 is a cross-sectional view schematically illustrating an electronic component device of another Example of the present invention.

Alternatively, as illustrated in FIG. 2, a method is also exemplified in which an electronic component 3 is disposed on a substrate 2 via a solder bump 4, followed by connecting in a reflow process, and then a resin composition is dispensed between the peripheral part of the electronic component 3 and the substrate 2 and cured to form a reinforcing part 10 as a side fill.

In the electronic component device of the present embodiment, increase in the viscosity of the resin composition is suppressed, and thus the resin composition can be securely dispensed in a narrow gap between the substrate 2 and the electronic component 3, thus ensuring reinforcement. In particular, the resin composition can be securely dispensed as a side fill material in the case of an electronic component device in which the reinforcing part 10 is formed in a small gap in, for example, the peripheral part of the electronic component 3.

The resin composition of the present embodiment, which can suppress crystallization without blending an additive such as a reactive diluent, can suppress decrease in the glass transition temperature after curing. Thus, a reinforcing part with a relatively high glass transition temperature can be obtained. As a result, even in the case where the electronic component device is subjected to a temperature cycle test or the like, a difference in thermal expansion coefficient between the reinforcing part and other parts does not easily occur, thus causing little cracks or damage.

In the present embodiment, an example was shown in which the resin composition is used for reinforcing bonding of the electronic component, but the reinforcing resin composition of the present invention can be used for bonding components other than the electronic component, and used as a reinforcing material for reinforcing the components themselves. For example, the reinforcing resin composition can be used for application for reinforcing composite materials, as insulating materials for electrical and electronic components (e.g., highly reliable semiconductor encapsulation materials) and laminated boards (e.g., printed circuit boards, and buildup substrates) or various types of composite materials including CFRP, adhesives, and coating materials.

The resin composition and the electronic component device according to the present embodiment is as described above, but it should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

EXAMPLES

Then, Examples and Comparative Examples of the present invention will be described. Note that the present invention should not to be construed as being limited to the following Examples.

Production of Resin Composition

The materials as shown below were blended in the formulation described in Tables 1 and 2 to prepare resin compositions of respective Examples and Comparative Examples.

For the production method, respective materials were stirred using a planetary mixer (5XDMV, available from Shinagawa Kogyosho) at 20 to 25° C. under reduced pressure to produce the resin compositions. Note that, in Example 4 and Comparative Example 4, only an epoxy compound and an amide-based thixotropic agent were heated in a separate vessel to disperse the thixotropic agent, followed by cooling to obtain a cooled intermediate. Then, the intermediate was charged in the stirring device.

Note that the numerals indicating the proportions of components in Tables are based on mass %.

Materials and Proportions

Epoxy compound 1: bisphenol A type epoxy resin YD-8125, available from Nippon Steel and Sumikin Chemical Co Ltd. (epoxy group at both ends, low halogen type).

Epoxy compound 2: bisphenol F type epoxy resin YDF-8170, available from Nippon Steel and Sumikin Chemical Co Ltd. (epoxy group at both ends, low halogen type).

Epoxy compound 3: bisphenol E type epoxy resin EPO-MK R710, available from Printec, Inc. (epoxy group at both ends).

Epoxy compound 4: bisphenol E type epoxy resin (low halogen) EPO-MK R1710, available from Printec, Inc. (epoxy group at both ends).

Epoxy compound 5: bisphenol A type epoxy resin YD-128, available from Nippon Steel and Sumikin Chemical Co Ltd. (epoxy group at both ends, high halogen type of epoxy compound 1).

Epoxy compound 6: bisphenol F type epoxy resin YDF-170, available from Nippon Steel and Sumikin Chemical Co Ltd. (epoxy group at both ends, high halogen type of epoxy compound 2).

Epoxy compound 7: 3',4'-epoxycyclohexylmethyl-3,4-epoxycyclohexanecarboxylate, available from Tokyo Chemical Industry Co., Ltd. (epoxy group at both ends, alicyclic epoxy compound).

Epoxy compound 8: triglycidyl isocyanurate, available from Tokyo Chemical Industry Co., Ltd. (epoxy compound having an isocyanuric backbone).

Epoxy compound 9: novolac type epoxy resin YDPN-638, available from Nippon Steel and Sumikin Chemical Co Ltd. (phenol novolac type epoxy resin).

Curing agent 1: modified alicyclic polyamine FXR-1121, available from T&K TOKA Corporation.

Curing agent 2: modified aliphatic polyamine FXR-1030, available from T&K TOKA Corporation.

Amide-based gelling agent 1: polyamide, TALEN VA-79, available from Kyoeisha Chemical Co., Ltd.

Amide-based gelling agent 2: N,N'-ethylene-bis-12-hydroxy stearyl amide ITOWAXJ-530, available from Itoh Oil Chemicals Co., Ltd.

Sorbitol-based gelling agent: 1,3:2,4-bis-O-(4-methylbenzylidene)-D-sorbitol, GEL ALL MD, available from New Japan Chemical Co., Ltd.

Fatty acid triglyceride: 12-hydroxystearic acid triglyceride, K-3 wax, available from Kawaken Fine Chemicals Co., Ltd.

Silica filler 1: SR-324, available from Tatsumori Ltd., average particle size: 4 μm.

Silica filler 2: OX 50, available from Nippon Aerosil Co., Ltd., average particle size: 50 nm.

Test 1 (Crystallization Test)

The crystallization test was conducted by the following method.

Only an epoxy compound in the resin composition was weighed and mixed, and then filled in a glass vessel, after which the glass vessel was sealed. The glass vessel was allowed to stand in a cold storage test vessel maintained at 0 to 10° C., and the presence of a deposit was visually observed after 180 days. The case where the deposit was present was evaluated as no good (denoted as ×, the same hereinafter), and the case where the deposit was absent was evaluated as good (denoted as ○, the same hereinafter).

Viscosity Stability Test

The viscosity stability test was conducted by the following method.

The viscosity of the resin composition was measured by an E-type viscometer (RE-100U, available from Toki Sangyo Co., Ltd.). The cone rotor was 3°-R7.7, and the revolution speed was 10 rpm. The temperature of the resin composition was controlled so as to be 20±1° C. with cooling water. The resin composition was allowed to stand in a cold storage test vessel maintained at 0 to 10° C., and the viscosity after 180 days was measured. The case where the change rate was less than 20% compared to the viscosity before charge in the cold storage test vessel was evaluated as good, and the case where the change rate was 20% or more was evaluated as no good.

Halogen Test

The halogen test was conducted in accordance with BS EN 14582:2007 (combustion method). As a measurement instrument, an ICS-1500 ion chromatography apparatus available from Dionex Corporation was used. Fluorine, chlorine, bromine, and iodine in the adhesive were calculated, and the case where the content of each element was 900 ppm or less was evaluated as good.

Glass Transition Temperature

Measurement of the glass transition temperature of respective resin compositions was conducted as follows.

The 2nd run of the DSC measurement to 180° C. with a temperature elevation rate of 10° C./min was measured, and the temperature at the intersection point between the original base line and the tangent line of the inflection point is determined as the glass transition temperature. Since the glass transition temperature is susceptible to the type or blend of the curing agent, determination was made whether the glass transition temperature was lowered or equivalent relative to Comparative Example in which the same components of the curing agent were used.

Results of respective tests are shown in Table 1

TABLE 1

| | Example 1 | Example 2 | Example 3 | Example 4 | Comparative Example 1 | Comparative Example 2 | Comparative Example 3 | Comparative Example 4 | Comparative Example 5 |
|---|---|---|---|---|---|---|---|---|---|
| Epoxy compound 1 | 3.0 | 3.0 | 3.0 | 5.0 | 3.0 | 3.0 | 50.0 | 50.0 | — |
| Epoxy compound 2 | 23.0 | 46.0 | 69.0 | 50.0 | 80.0 | 92.0 | 50.0 | 50.0 | — |
| Epoxy compound 3 | 5.0 | 5.0 | 5.0 | 10.0 | 5.0 | — | — | — | — |
| Epoxy compound 4 | 69.0 | 46.0 | 23.0 | 35.0 | 12.0 | 5.0 | — | — | — |
| Epoxy compound 5 | — | — | — | — | — | — | — | — | 50.0 |
| Epoxy compound 6 | — | — | — | — | — | — | — | — | 50.0 |
| Curing agent 1 | 20.0 | 20.0 | 20.0 | 7.0 | 20.0 | 20.0 | 20.0 | 7.0 | 20.0 |
| Curing agent 2 | — | — | — | 7.0 | — | — | — | 7.0 | — |
| Amide-based gelling agent 1 | — | — | — | 2.0 | — | — | — | 2.0 | — |
| Silica filler 1 | — | — | — | 120.0 | — | — | — | 120.0 | — |
| Silica filler 2 | — | — | — | 12.0 | — | — | — | 12.0 | — |
| Test result | | | | | | | | | |
| Crystallization test | ○ | ○ | ○ | ○ | x | x | x | x | ○ |
| Viscosity stability | ○ | ○ | ○ | ○ | x | x | x | x | ○ |
| Halogen test (Cl: ppm) | ○ 700 ppm | ○ 665 ppm | ○ 630 ppm | ○ 355 ppm | ○ 614 ppm | ○ 563 ppm | ○ 580 ppm | ○ 300 ppm | x 1205 ppm |
| Glass transition temperature measurement | 160.0 | 157.0 | 151.0 | 118.0 | 147.0 | 145.0 | 157.0 | 121.0 | 168.0 |
| | ○ Equivalent to Comparative Example 3 | ○ Equivalent to Comparative Example 3 | ○ Equivalent to Comparative Example 3 | ○ Equivalent to Comparative Example 4 | — | — | — | — | — |

As shown in Table 1, for respective Examples, crystallization, viscosity stability, and the halogen content were good, and decrease in the glass transition temperature was not observed. On the contrary, Comparative Examples 1 to 4 were no good for crystallization, viscosity stability, and for Comparative Example 5, crystallization and viscosity stability were good, but the halogen content exceeded 900 ppm. That is, in Examples of the invention of the present application, crystallization and viscosity stability were able to be made favorable without increasing the halogen content.

Test 2 (Heat Sagging Property Test)

The heat sagging property was measured by the following method.

The heat sagging property was measured in accordance with the method described in the sagging in printing test of JIS Z 3284-3. Specifically, the respective resin compositions of respective Examples and Comparative Example described in Table 2 were printed on a copper plate using a stainless steel metal mask with a predetermined pattern specified in JIS described above (opening size: two types of 3.0 mm×0.7 mm and 3.0 mm×1.5 mm; intervals between openings: 0.2 mm to 1.2 mm, at every 0.1 mm; mask thickness: 0.2 mm), and then the metal mask was removed, followed by heating at 150° C. for 10 minutes.

Of the patterns of the respective copper plates printed in two types of sizes, a pattern with a worse result was evaluated. The minimum interval at which the adjacent resin compositions printed in a pattern did not contact to each other after heating was shown in Table 2. For example, the case of "0.2 mm Pass" in the table indicates that the resin compositions did not contact to each other in the interval between openings of 0.2 mm, and the case of "0.6 mm Pass" indicates that the resin compositions did not contact to each other in the interval between openings of 0.6 mm, but contacted in the interval of 0.5 mm.

TABLE 2

| | Example 5 | Example 6 | Example 7 | Example 8 | Example 9 | Example 10 | Example 11 | Example 12 |
|---|---|---|---|---|---|---|---|---|
| Epoxy compound 1 | | | 3.0 | 5.0 | 5.0 | 5.0 | 5.0 | 5.0 |
| Epoxy compound 2 | | 23.0 | | 50.0 | 50.0 | 50.0 | 50.0 | 40.0 |
| Epoxy compound 3 | 5.0 | 5.0 | 5.0 | 10.0 | 10.0 | 10.0 | 10.0 | 10.0 |
| Epoxy compound 4 | 95.0 | 72.0 | 92.0 | 35.0 | 35.0 | 35.0 | 35.0 | 35.0 |
| Epoxy compound 7 | | | | | | | | 10.0 |
| Epoxy compound 8 | | | | | | | | |
| Epoxy compound 9 | | | | | | | | |
| Modified alicyclic polyamine | 7.0 | 7.0 | 7.0 | 7.0 | 7.0 | 7.0 | 7.0 | 7.0 |
| Modified aliphatic polyamine | 7.0 | 7.0 | 7.0 | 7.0 | 7.0 | 7.0 | 7.0 | 7.0 |
| Amide-based gelling agent 1 | 2.0 | 2.0 | 2.0 | 2.0 | | | 4.0 | 2.0 |

TABLE 2-continued

|  |  |  |  |  |  |  |  |  |
|---|---|---|---|---|---|---|---|---|
| Amide-based gelling agent 2 |  |  |  |  | 2.0 |  |  |  |
| Sorbitol-based gelling agent |  |  |  |  |  | 2.0 |  |  |
| Fatty acid triglyceride-based gelling agent |  |  |  |  |  |  |  |  |
| Silica filler 1 | 120 | 120 | 120 | 120.0 | 120 | 120.0 | 120.0 | 120.0 |
| Silica filler 2 | 12 | 12 | 12 | 12 | 12 | 12 | 12.0 | 12 |

Test result

|  |  |  |  |  |  |  |  |  |
|---|---|---|---|---|---|---|---|---|
| Viscosity Pa · s | 71.7 | 72.3 | 72.6 | 69.0 | 71.7 | 81.9 | 82.2 | 58.8 |
| Structural viscosity ratio | 2.8 | 2.9 | 2.7 | 3.1 | 3.0 | 7.3 | 3.5 | 2.7 |
| Heat sagging test (150° C. 10 min) | 0.2 mm Pass | 0.2 mm Pass | 0.2 mm Pass | 0.2 mm Pass | 0.2 mm Pass | 0.2 mm Pass | 0.2 mm Pass | 0.2 mm Pass |

|  | Example 13 | Example 14 | Example 15 | Example 16 | Example 17 | Example 18 | Comparative Example 6 |
|---|---|---|---|---|---|---|---|
| Epoxy compound 1 | 5.0 | 5.0 | 5.0 | 5.0 | 5.0 | 5.0 | 50.0 |
| Epoxy compound 2 | 40.0 | 40.0 | 50.0 | 50.0 | 50.0 | 50.0 | 50.0 |
| Epoxy compound 3 | 10.0 | 10.0 | 10.0 | 10.0 | 10.0 | 10.0 |  |
| Epoxy compound 4 | 35.0 | 35.0 | 35.0 | 35.0 | 35.0 | 35.0 |  |
| Epoxy compound 7 |  |  |  |  |  |  |  |
| Epoxy compound 8 | 10.0 |  |  |  |  |  |  |
| Epoxy compound 9 |  | 10.0 |  |  |  |  |  |
| Modified alicyclic polyamine | 7.0 | 7.0 | 7.0 | 7.0 | 7.0 | 7.0 | 7.0 |
| Modified aliphatic polyamine | 7.0 | 7.0 | 7.0 | 7.0 | 7.0 | 7.0 | 7.0 |
| Amide-based gelling agent 1 | 2.0 | 2.0 |  | 1.0 |  |  |  |
| Amide-based gelling agent 2 |  |  |  |  |  |  |  |
| Sorbitol-based gelling agent |  |  |  |  |  |  |  |
| Fatty acid triglyceride-based gelling agent |  |  | 4.0 |  | 10.0 | 15.0 |  |
| Silica filler 1 | 120.0 | 120.0 | 120.0 | 120.0 | 120.0 | 120.0 | 120.0 |
| Silica filler 2 | 12 | 12 | 12 | 12 | 12 | 12 | 12.0 |

Test result

|  | | | | | | | |
|---|---|---|---|---|---|---|---|
| Viscosity Pa · s | 99.0 | 88.2 | 67.5 | 57.6 | 88.5 | 92.7 | 66.3 |
| Structural viscosity ratio | 2.6 | 2.2 | 2.5 | 2.2 | 2.9 | 2.9 | 2.1 |
| Heat sagging test (150° C. 10 min) | 0.2 mm Pass | 0.2 mm Pass | 0.2 mm Pass | 0.2 mm Pass | 0.2 mm Pass | 0.2 mm Pass | 0.6 mm Pass |

Viscosity and Structural Viscosity Ratio

The viscosity was measured by the following method.

An E type viscometer (available from RE-100U, Toki Sangyo Co., Ltd.) was used, the cone rotor was 3°-R7.7, and the revolution speed was 10 rpm. The temperature of the resin composition was controlled so as to be 20±1° C. with cooling water.

The structural viscosity ratio was calculated, from the following equation, using the viscosity at a revolution speed of 10 rpm and the viscosity at a revolution speed of 1 rpm measured in the same measurement method.

Structural viscosity ratio=viscosity at 1 rpm/viscosity at 10 rpm.

Results are shown in Table 2.

In addition, the results of the viscosities and the structural viscosity ratios of the first day, 7 days after, and 30 days after (1 month after) are shown in Table 3.

TABLE 3

|  | Viscosity (Pa · s) | | | | | | | |
|---|---|---|---|---|---|---|---|---|
|  | Example 5 | Example 6 | Example 7 | Example 8 | Example 9 | Example 10 | Example 11 | Example 12 |
| 1 day | 71.7 | 72.3 | 72.6 | 69.0 | 71.7 | 81.9 | 82.2 | 58.8 |
| 7 day | 73.5 | 70.2 | 71.1 | 70.5 | 72.3 | 85.5 | 87.6 | 54.9 |
| 1 month | 74.4 | 69.3 | 71.4 | 71.1 | 69.6 | 68.1 | 94.8 | 55.8 |

TABLE 3-continued

| | Viscosity (Pa · s) | | | | | | |
|---|---|---|---|---|---|---|---|
| | Example 13 | Example 14 | Example 15 | Example 16 | Example 17 | Example 18 | Comparative Example 6 |
| 1 day | 99.0 | 88.2 | 67.5 | 57.6 | 88.5 | 92.7 | 66.3 |
| 7 day | 101.1 | 91.8 | 65.1 | 55.8 | 90 | 100.5 | 63.0 |
| 1 month | 105.9 | 94.5 | 62.7 | 58.5 | 94 | 99.3 | 67.2 |

| | Structural viscosity ratio | | | | | | |
|---|---|---|---|---|---|---|---|
| | Example 5 | Example 6 | Example 7 | Example 8 | Example 9 | Example 10 | Example 11 | Example 12 |
| 1 day | 2.8 | 2.9 | 2.7 | 3.1 | 3.0 | 7.3 | 3.5 | 2.7 |
| 7 day | 2.7 | 2.7 | 2.7 | 3.1 | 3.0 | 6.5 | 3.3 | 2.1 |
| 1 month | 2.8 | 2.7 | 2.8 | 3.0 | 3.1 | 7.1 | 3.6 | 2.2 |

| | Structural viscosity ratio | | | | | | |
|---|---|---|---|---|---|---|---|
| | Example 13 | Example 14 | Example 15 | Example 16 | Example 17 | Example 18 | Comparative Example 6 |
| 1 day | 2.6 | 2.2 | 2.5 | 2.2 | 2.9 | 2.9 | 2.1 |
| 7 day | 2.5 | 2.3 | 2.3 | 2.0 | 2.7 | 3.1 | 1.8 |
| 1 month | 2.6 | 2.3 | 2.3 | 2.1 | 2.6 | 2.6 | 1.6 |

As shown in Table 2, the structural viscosity ratio was higher in respective Example than Comparative Example. A higher structural viscosity ratio indicates a numerical value that can suppress sagging. This was clear from the fact that, in the heat sagging test, the resin compositions did not contact to 0.2 mm in respective Examples, whereas the resin compositions did not contact to 0.6 mm in Comparative Example.

Further, as shown in Table 3, the structural viscosity ratio was high even after 1 month in respective Examples. Meanwhile, the structural viscosity ratio in Comparative Example was originally lower than Examples, but further lowered after 1 month.

REFERENCE SIGNS LIST

Electronic component device
Substrate
Electronic component
Solder bump
Reinforcing part

What is claimed is:

1. A reinforcing resin composition comprising: an epoxy compound, a curing agent, and a gelling agent;
    wherein the epoxy compound is a bisphenol E type epoxy resin alone or a mixture of a bisphenol E type epoxy resin with one or more additional epoxy resins, provided that the bisphenol E type epoxy resin is present in an amount of 25 mass % or more and 100 mass % or less relative to the total mass of the epoxy compound; and
    wherein the gelling agent has an action of gelling the epoxy compound and can prevent the resin composition from sagging when the resin composition is applied and heat cured.

2. The reinforcing resin composition according to claim 1, wherein the one or more additional epoxy resins is present in the epoxy compound and is selected from the group consisting of a bisphenol A type epoxy resin and a bisphenol F type epoxy resin.

3. The reinforcing resin composition according to claim 1, wherein the one or more additional epoxy resins is present in the epoxy compound and is a combination of a bisphenol A type epoxy resin and a bisphenol F type epoxy resin.

4. The reinforcing resin composition according to claim 1, wherein all epoxy resins present in the epoxy compound have an epoxy group at both ends.

5. The reinforcing resin composition according to claim 1, wherein the epoxy compound has a chlorine content of 900 ppm or less.

6. The reinforcing resin composition according to claim 1, wherein the curing agent is at least one type selected from the group consisting of alicyclic polyamines, aliphatic polyamines, and modified products thereof.

7. The reinforcing resin composition according to claim 1, wherein the curing agent is present in an amount of from 5 parts by mass to 40 parts by mass, per 100 parts by mass of the epoxy compound.

8. The reinforcing resin composition according to claim 1, wherein the gelling agent is at least one type selected from the group consisting of amide-based gelling agents, sorbitol-based gelling agents, and fatty acid triglycerides.

9. The reinforcing resin composition according to claim 1, wherein the gelling agent is present in an amount of from 0.5 part by mass to 20 parts by mass, per 100 parts by mass of the epoxy compound.

10. The reinforcing resin composition according to claim 1, wherein the gelling agent is an amide-based gelling agent and the amide-based gelling agent is present in an amount of from 1 part by mass to 3 parts by mass, per 100 parts by mass of the epoxy compound.

11. The reinforcing resin composition according to claim 1, wherein the gelling agent is a fatty acid triglyceride gelling agent and the fatty acid triglyceride gelling agent is present in an amount of from 2 parts by mass to 20 parts by mass, per 100 parts by mass of the epoxy compound.

12. The reinforcing resin composition according to claim 1, wherein the gelling agent is a sorbitol-based gelling agent and the sorbitol-based gelling agent is present in an amount of from 0.1 part by mass to 10 parts by mass, per 100 parts by mass of the epoxy compound.

13. The reinforcing resin composition according to claim 1, wherein the gelling agent is a sorbitol-based gelling agent and the sorbitol-based gelling agent is present in an amount of from 0.5 part by mass to 5 parts by mass, per 100 parts by mass of the epoxy compound.

14. The reinforcing resin composition according to claim 1, further comprising a filler, wherein the filler is present in an amount of 30 parts by mass or more and less than 180 parts by mass per 100 parts by mass of the epoxy compound.

15. The reinforcing resin composition according to claim 1, which is cured at a temperature of 80° C. or higher and 200° C. or lower.

16. An electronic component device in which a substrate and an electronic component are bonded via a solder bump, the electronic component device comprising: a reinforcing part including the reinforcing resin composition according to claim 1 between the substrate and the electronic component.

17. The electronic component device according to claim 16, wherein the reinforcing part is formed between a peripheral part of the electronic component and the substrate.

* * * * *